(12) United States Patent
Cheng (10) Patent No.: US 11,145,743 B2
(45) Date of Patent: Oct. 12, 2021

(54) TRANSISTOR DEVICE HAVING A COMB-SHAPED CHANNEL REGION TO INCREASE THE EFFECTIVE GATE WIDTH

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/397,723

(22) Filed: Apr. 29, 2019

(65) Prior Publication Data

US 2020/0343361 A1 Oct. 29, 2020

(51) Int. Cl.
*H01L 29/66* (2006.01)
*H01L 29/423* (2006.01)

(52) U.S. Cl.
CPC .. *H01L 29/66484* (2013.01); *H01L 29/42368* (2013.01); *H01L 29/66545* (2013.01); *H01L 29/66553* (2013.01); *H01L 29/66795* (2013.01)

(58) Field of Classification Search
CPC ........... H01L 29/66484; H01L 29/0669; H01L 29/068; H01L 29/0665; H01L 2924/13061; H01L 29/66439; H01L 29/66469; H01L 29/7853; H01L 29/78687; H01L 29/78696
See application file for complete search history.

(56) References Cited

U.S. PATENT DOCUMENTS

| | | | |
|---|---|---|---|
| 5,614,762 A | 3/1997 | Kanamori et al. | |
| 6,150,254 A | 11/2000 | Kito | |
| 6,392,278 B1 | 5/2002 | Kimura | |
| 8,507,959 B2 | 8/2013 | Huang et al. | |
| 8,754,469 B2 | 6/2014 | Pendharkar et al. | |
| 9,224,861 B2 | 12/2015 | Yang et al. | |
| 9,685,499 B1 | 6/2017 | Bi et al. | |
| 10,014,390 B1* | 7/2018 | Bouche | H01L 29/42376 |
| 10,403,739 B2* | 9/2019 | Kim | H01L 29/4966 |
| 2001/0025966 A1 | 10/2001 | Mizuhara | |
| 2010/0032754 A1 | 2/2010 | Kawaguchi | |
| 2017/0278884 A1* | 9/2017 | Yang | H01L 27/14643 |
| 2018/0175191 A1 | 6/2018 | Pendharkar et al. | |

FOREIGN PATENT DOCUMENTS

EP 0 724 296 A2 7/1996

* cited by examiner

*Primary Examiner* — Wael M Fahmy
*Assistant Examiner* — Quinton A Brasfield
(74) *Attorney, Agent, or Firm* — Tutunjian & Bitetto, P.C.; Randall Bluestone (57) ABSTRACT

A method of forming a comb-shaped transistor device is provided. The method includes forming a stack of alternating sacrificial spacer segments and channel segments on a substrate. The method further includes forming channel sidewalls on opposite sides of the stack of alternating sacrificial spacer segments and channel segments, and dividing the stack of alternating sacrificial spacer segments and channel segments into alternating sacrificial spacer slabs and channel slabs, wherein the channel slabs and channel sidewalls form a pair of comb-like structures. The method further includes trimming the sacrificial spacer slabs and channel slabs to form a nanosheet column of sacrificial plates and channel plates, and forming source/drains on opposite sides of the sacrificial plates and channel plates.

15 Claims, 10 Drawing Sheets

TRANSISTOR DEVICE HAVING A COMB-SHAPED CHANNEL REGION TO INCREASE THE EFFECTIVE GATE WIDTH

BACKGROUND

The present invention generally relates to field effect transistor devices, and more particularly to adjacent pairs of field effect transistor devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a comb-shaped transistor device is provided. The method includes forming a stack of alternating sacrificial spacer segments and channel segments on a substrate. The method further includes forming channel sidewalls on opposite sides of the stack of alternating sacrificial spacer segments and channel segments, and dividing the stack of alternating sacrificial spacer segments and channel segments into alternating sacrificial spacer slabs and channel slabs, wherein the channel slabs and channel sidewalls form a pair of comb-like structures. The method further includes trimming the sacrificial spacer slabs and channel slabs to form a nanosheet column of sacrificial plates and channel plates, and forming source/drains on opposite sides of the sacrificial plates and channel plates.

In accordance with another embodiment of the present invention, a method of forming a comb-shaped transistor device is provided. The method includes forming a stack of alternating sacrificial spacer segments and channel segments on a substrate, and forming channel sidewalls on opposite sides of the stack of alternating sacrificial spacer segments and channel segments. The method further includes forming a pair of partition templates on the exposed surface of a topmost sacrificial spacer segment, wherein a center portion of the topmost sacrificial spacer segment is exposed between the pair of partition templates. The method further includes dividing the stack of alternating sacrificial spacer segments and channel segments into alternating sacrificial spacer slabs and channel slabs, wherein the channel slabs and channel sidewalls form an adjacent pair of comb-like structures, and forming a dummy gate structure across the pair of comb-like structures. The method further includes trimming the sacrificial spacer slabs and channel slabs using the dummy gate structure as a mask to form a nanosheet column of sacrificial plates and channel plates, and forming source/drains on opposite sides of the sacrificial plates and channel plates.

In accordance with yet another embodiment of the present invention, a field effect transistor device with a comb-like channel structure is provided. The field effect transistor device includes channel sidewall on a substrate, and a plurality of channel plates in physical and electrical contact with the channel sidewall, wherein the channel plates extend outward from a side face of the channel sidewall. The field effect transistor device further includes a gate dielectric layer on a portion of the surfaces of the plurality of channel plates and the channel sidewall, and a conductive gate electrode on the gate dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a comb-shaped transistor device that combine aspects of a fin field effect transistor and nanosheet transistor to increase the effective drive current, while maintaining the device size.

Embodiments of the present invention provide a method of fabricating a comb-shaped transistor device by forming channel sidewalls on semiconductor nanosheet layers.

Exemplary applications/uses to which the present invention can be applied include, but are not limited to: semiconductor transistors, electrical circuits, and semiconductor chips.

It is to be understood that aspects of the present invention will be described in terms of a given illustrative architecture; however, other architectures, structures, substrate materials and process features and steps can be varied within the scope of aspects of the present invention.

Figure 1:
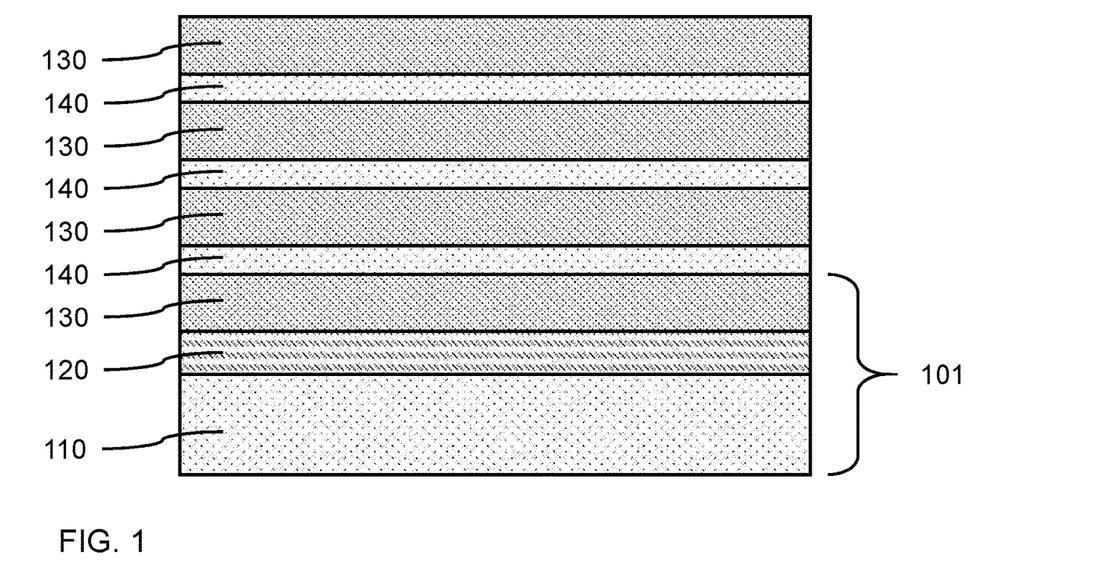
FIG. 1 is a cross-sectional side view showing a series of alternating sacrificial spacer layers and channel layers on an insulating layer of a substrate, in accordance with an embodiment of the present invention.

Referring now to the drawings in which like numerals represent the same or similar elements and initially to FIG. 1, a series of alternating sacrificial spacer layers and channel layers on an insulating layer of a substrate is shown, in accordance with an embodiment of the present invention.

In one or more embodiments, a series of alternating sacrificial spacer layers 130 and channel layers 140 can be formed on a semiconductor-on-insulator substrate 101, where the semiconductor-on-insulator substrate 101 can include a support layer 110, an insulating layer 120, and an active semiconductor layer that can be the bottom-most sacrificial spacer layer 130. In various embodiments, the sacrificial spacer layers 130 and channel layers 140 can be formed by epitaxial growth or heteroepitaxial growth on an underlying layer, where the underlying layer can be a single crystal. In various embodiments, the support layer 110 can be a semiconductor material, where the semiconductor material can be single crystal, polycrystalline, microcrystalline, and/or amorphous, where the support layer 110 can provide physical support for the insulating layer 120 and active semiconductor layer. The insulating layer 120 can be an insulating dielectric material, for example, silicon oxide (SiO) or silicon nitride (SiN), where the insulating layer 120 can be a buried oxide layer (BOX) between the active semiconductor layer and the support layer 110.

In one or more embodiments, the active semiconductor layer can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)), where the material of the active semiconductor layer can be selectively removable relative to an overlying channel layer 140.

In one or more embodiments, the channel layers 140 can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)). The channel layers 140 can be single crystal to provide for epitaxial or heteroepitaxial growth.

In one or more embodiments, the sacrificial spacer layers 130 can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)), where the material of the sacrificial spacer layers 130 is different from the material of the channel layers 140 to allow selective removal, while providing for epitaxial or heteroepitaxial growth on the alternating layers. Alternatively, the alternating sacrificial spacer layers and channel layers can formed on a bulk substrate.

In one or more embodiments, the sacrificial spacer layers 130 can have a thickness in a range of about 6 nanometers (nm) to about 30 nm, or about 8 nm to about 15 nm, to provide sufficient distance between the channel layers 140 to form a gate-all-around (GAA) structure.

In one or more embodiments, the channel layers 140 can have a thickness in a range of about 4 nanometers (nm) to about 12 nm, or about 6 nm to about 9 nm, although other thicknesses are also contemplated.

In a non-limiting exemplary embodiment, the semiconductor-on-insulator substrate 101 can be a silicon-germanium-on-insulator (SGOI) substrate, where the active semiconductor layer is silicon-germanium, and the active semiconductor layer forms the bottom-most sacrificial spacer layer 130 used for epitaxial or heteroepitaxial growth of the subsequent alternating layers.

In various embodiments, the topmost layer of the alternating sacrificial spacer layers 130 and channel layers 140 can be a sacrificial spacer layer 130 to provide space for a gate-all-around (GAA) structure on a topmost channel layer 140.

Figure 2:
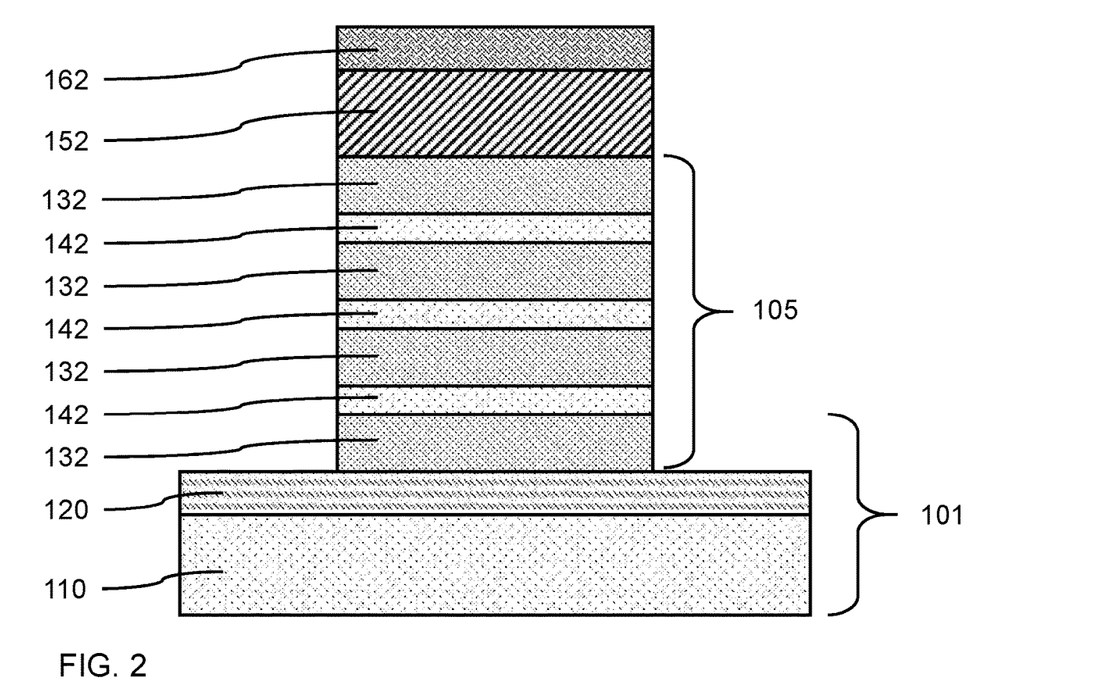
FIG. 2 is a cross-sectional side view showing a masking template and a segment template on a patterned stack of alternating sacrificial spacer layers and channel layers, in accordance with an embodiment of the present invention.

FIG. 2 is a cross-sectional side view showing a masking template and a segment template on a patterned stack of alternating sacrificial spacer layers and channel layers, in accordance with an embodiment of the present invention.

In one or more embodiments, a hardmask layer can be formed on the stack of alternating sacrificial spacer layers 130 and channel layers 140, where the hardmask layer can be formed by a deposition (e.g., chemical vapor deposition (CVD), plasma enhanced CVD (PECVD)). In various embodiments, the hardmask layer can be a dielectric material, including, but not limited to, silicon oxide (SiO), silicon nitride (SiN), silicon oxynitride (SiON), silicon carbonitride (SiCN), silicon oxy carbonitride (SiOCN), silicon boro carbonitride (SiBCN), and combinations thereof.

In one or more embodiments, a masking layer can be formed on the hardmask layer. In various embodiments, the masking layer can be a softmask layer that can be a lithography resist material that can be patterned and developed using lithographic processes. The masking layer can be a polymer resist material. In various embodiments, the masking layer can be patterned and developed to form masking templates 162 on the hardmask layer. The pattern can be transferred from the masking templates 162 to the hardmask layer by etching, for example, a directional etch (e.g., reactive ion etch (RIE)) to form segment templates 152. In various embodiments, the masking template 162 can also be a hardmask. For example, the masking templates 162 can be formed by using lithography followed by etching. Other suitable techniques, such as sidewall image transfer (SIT), self-aligned double patterning (SADP), self-aligned multiple patterning (SAMP), self-aligned quadruple patterning (SAQP) can be used to form the masking templates 162.

In one or more embodiments, portions of the sacrificial spacer layers 130 and channel layers 140 exposed by the segment templates 152 can be removed using a directional etch (e.g., RIE) to form a stack 105 of alternating sacrificial spacer segments 132 and channel segments 142 on the insulating layer 120.

Figure 3:
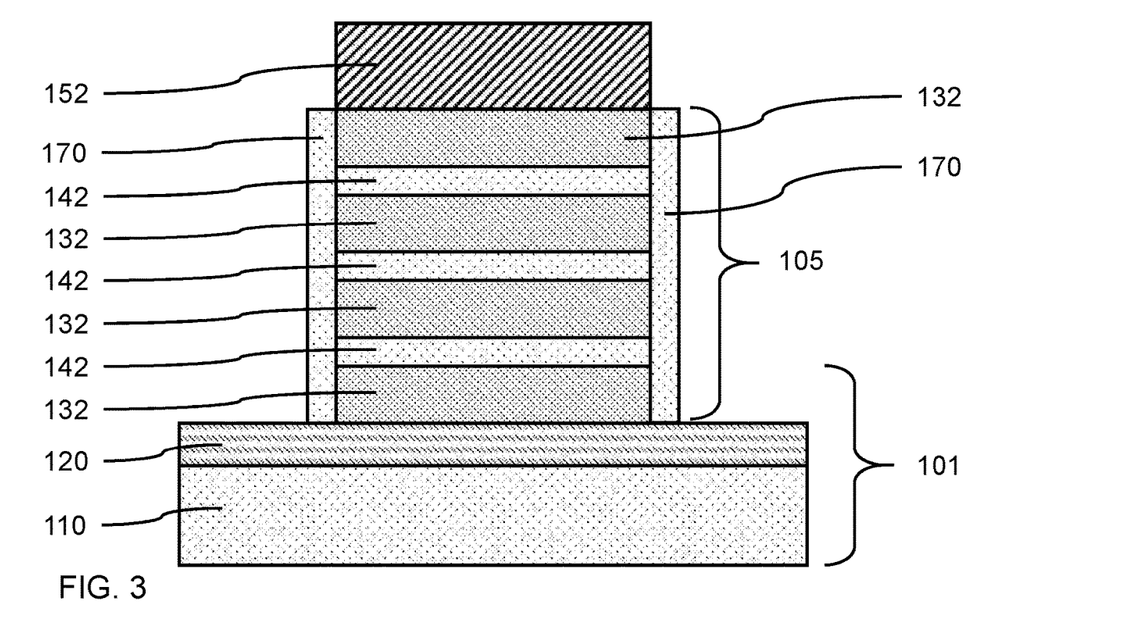
FIG. 3 is a cross-sectional side view showing the masking template removed and channel sidewalls formed on opposite sides of the stack of alternating sacrificial spacer segments and channel segments, in accordance with an embodiment of the present invention.

FIG. 3 is a cross-sectional side view showing the masking templates removed and channel sidewalls formed on opposite sides of the stack of alternating sacrificial spacer segments and channel segments, in accordance with an embodiment of the present invention.

In one or more embodiments, the masking templates 162 can be removed to expose the underlying segment templates 152, where the masking templates 162 can be removed by etching, chemical stripping, and/or ashing.

In one or more embodiments, channel sidewalls 170 can be formed on opposite sides of the stack 105 of alternating sacrificial spacer segments 132 and channel segments 142, where the channel sidewalls 170 can be formed by lateral epitaxial growth on the exposed surfaces.

In various embodiments, the channel sidewalls 170 can about the same width as the thickness of the channel segments 142. The channel sidewalls 170 can have a width in a range of about 4 nanometers (nm) to about 12 nm, or about 6 nm to about 9 nm, although other thicknesses are also contemplated.

Figure 4:
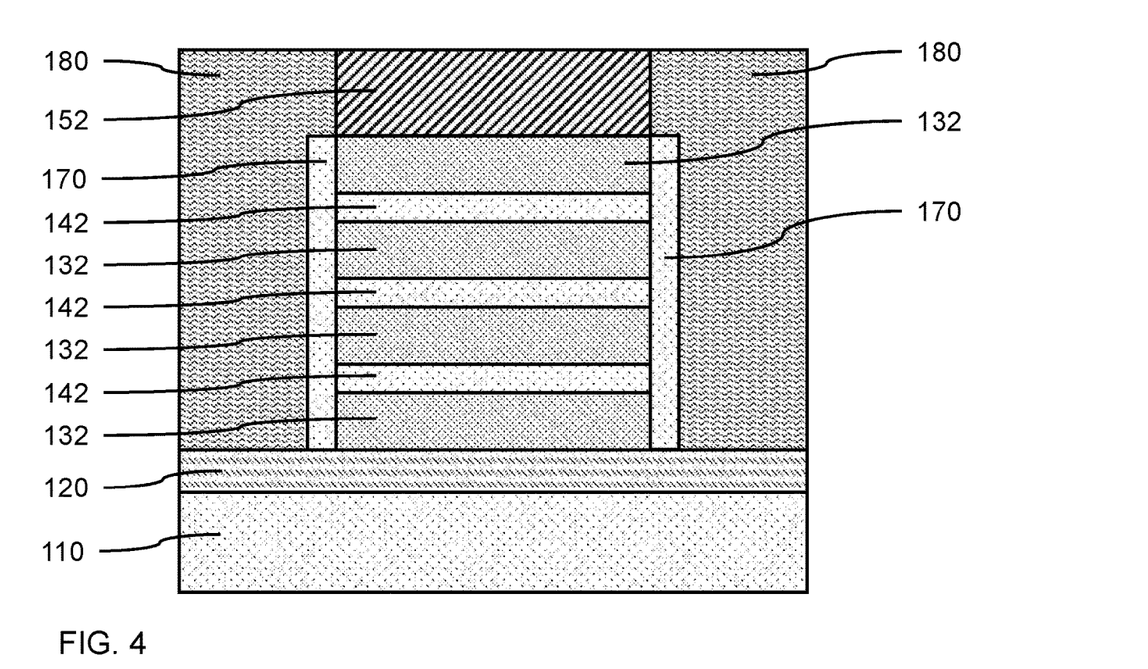
FIG. 4 is a cross-sectional side view showing a sacrificial fill layer on the channel sidewalls and segment templates, in accordance with an embodiment of the present invention.

FIG. 4 is a cross-sectional side view showing a sacrificial fill layer on the channel sidewalls and segment templates, in accordance with an embodiment of the present invention.

In one or more embodiments, a sacrificial fill layer 180 can be formed on the channel sidewalls 170 and segment templates 152, where the sacrificial fill layer 180 can be formed by a blanket deposition, for example, chemical vapor deposition (CVD), plasma enhanced CVD (PECVD), a spin-on process, or a combination thereof. Excess sacrificial fill layer material can be removed using, for example, chemical-mechanical polishing (CMP), wet chemical etching, or a combination thereof. The sacrificial fill layer 180 can cover the channel sidewalls 170.

In various embodiments, the sacrificial fill layer 180 can be an insulating dielectric material, including, but not limited to, silicon oxide (SiO), silicon nitride (SiN), silicon oxynitride (SiON), a low-k dielectric material, amorphous carbon (a-C), or a combination thereof. A low-k dielectric material can be, for example, fluorine-doped silicon oxide (SiO:F), carbon-doped silicon oxide (SiO:C), a polymeric material, for example, tetraethyl orthosilicate (TEOS), hydrogen silsesquioxane (HSQ) and methylsilsesquioxane (MSQ), organo-silicon compounds (SiCOH), and combinations thereof. The sacrificial fill layer 180 can be a dielectric material that can be selectively removed from the channel sidewalls 170 and/or insulating layer 120.

Figure 5:
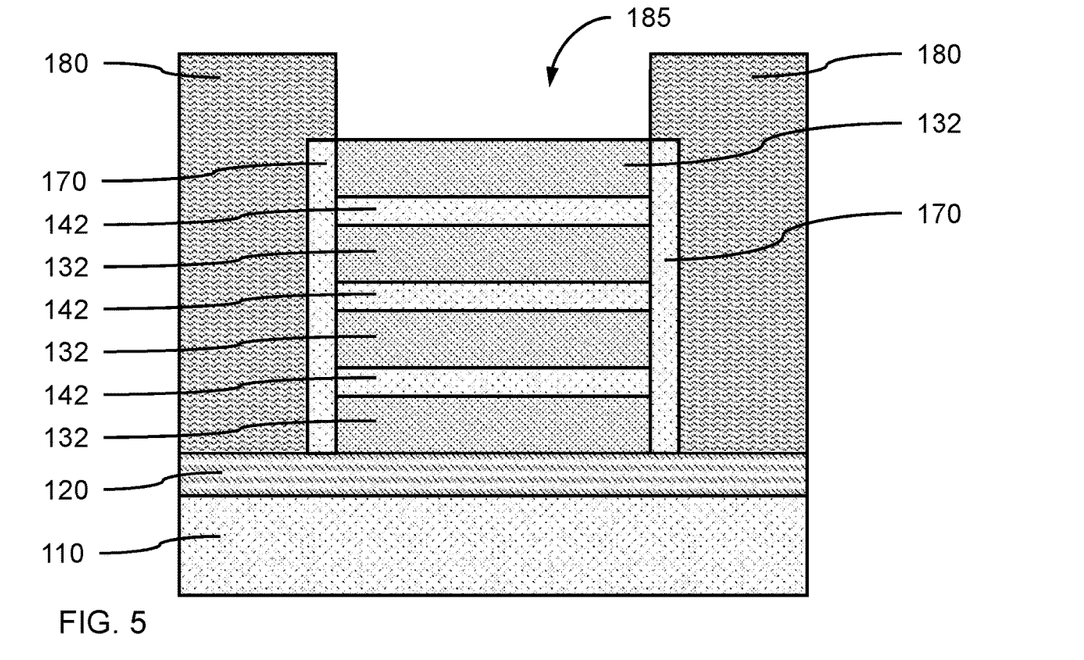
FIG. 5 is a cross-sectional side view showing the segment templates removed from the stack to expose a topmost sacrificial spacer layer and inner sidewalls of the sacrificial fill layer, in accordance with an embodiment of the present invention.

FIG. 5 is a cross-sectional side view showing the segment templates removed from the stack to expose a topmost sacrificial spacer segment and inner sidewalls of the sacrificial fill layer, in accordance with an embodiment of the present invention.

In one or more embodiments, the segment templates 152 can be removed from the stack 105 to expose a topmost sacrificial spacer segment 132 and inner sidewalls of the sacrificial fill layer 180. The segment templates 152 can be removed using a selective isotropic etch, for example, a wet chemical etch or dry plasma etch. The sacrificial fill layer 180 can remain on the top surfaces of the channel sidewalls 170.

Figure 6:
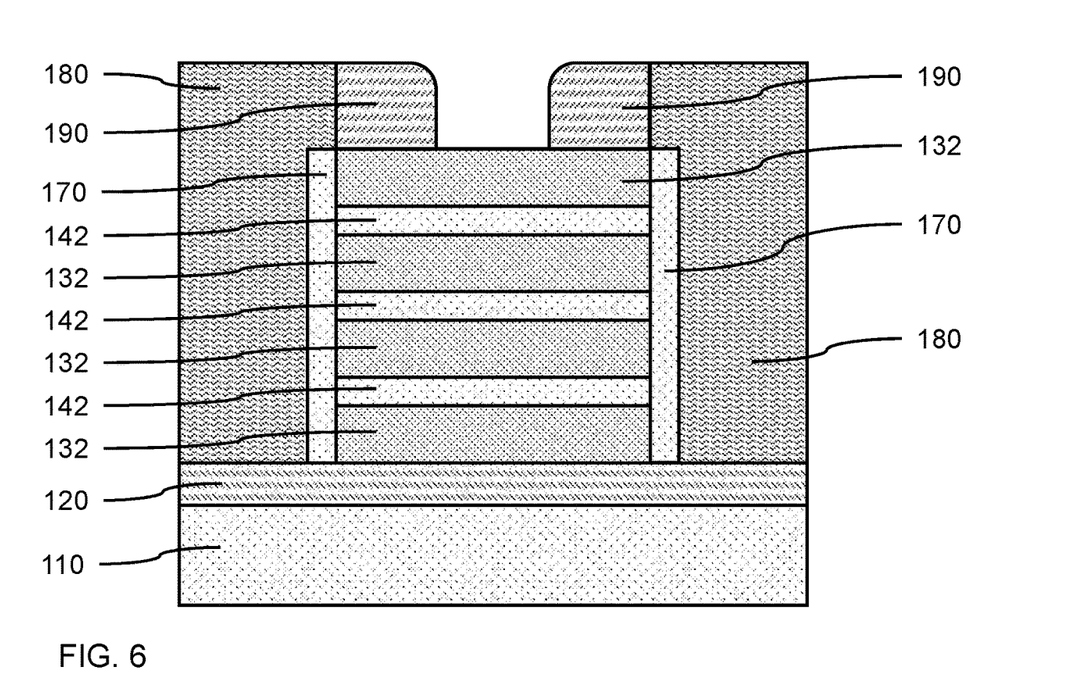
FIG. 6 is a cross-sectional side view showing partition templates formed on the exposed topmost sacrificial spacer segment and inner sidewalls of the sacrificial fill layer, in accordance with an embodiment of the present invention.

FIG. 6 is a cross-sectional side view showing partition templates formed on the exposed topmost sacrificial spacer segment and inner sidewalls of the sacrificial fill layer, in accordance with an embodiment of the present invention.

In one or more embodiments, partition templates 190 can be formed on the exposed topmost sacrificial spacer segment 132 and inner sidewalls of the sacrificial fill layer 180, where the partition templates 190 can be formed by blanket depositing a hardmask material in the opening(s) 185 formed by removing the segment templates 152 and planarizing the hardmask material using CMP. The hardmask material in the opening(s) 185 can be patterned and partially removed using lithographic and etching processes to form the partition templates 190 in the opening(s) 185. A pair of partition templates 190 can be formed on the exposed surface of a topmost sacrificial spacer segment 132. A center portion of the topmost sacrificial spacer segment 132 can be exposed between the pair of partition templates 190.

Figure 7:
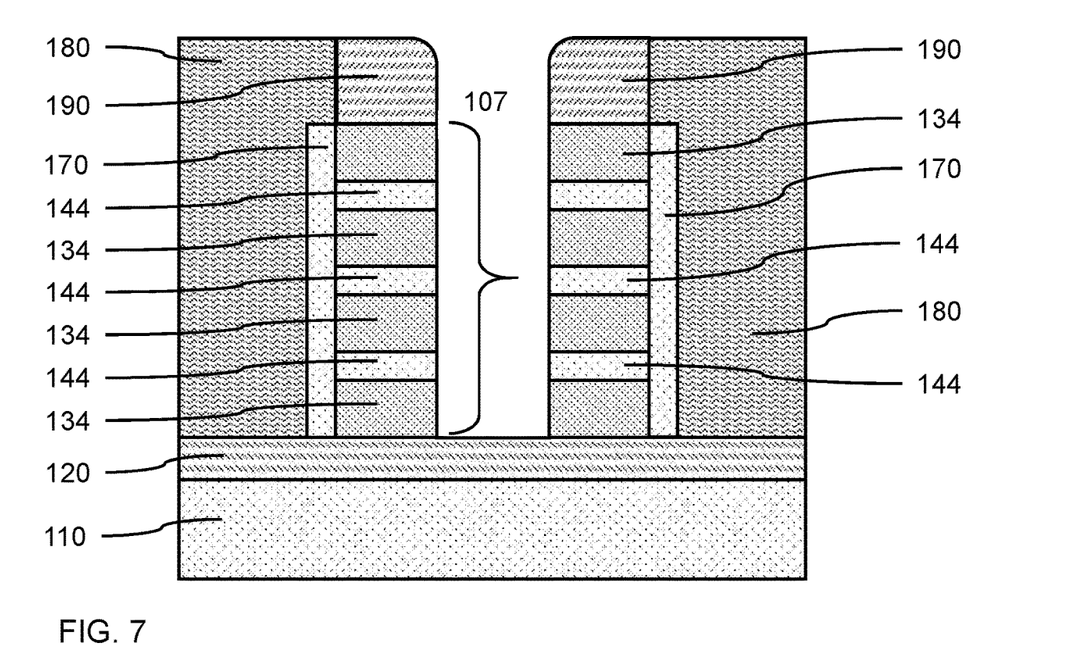
FIG. 7 is a cross-sectional side view showing the central portions of the sacrificial spacer segments and channel segments exposed between the partition templates removed to form a pair of free-standing partial stacks, in accordance with an embodiment of the present invention.

FIG. 7 is a cross-sectional side view showing the central portions of the sacrificial spacer segments and channel segments exposed between the partition templates removed to form a pair of free-standing partial stacks, in accordance with an embodiment of the present invention.

In one or more embodiments, the central portions of the sacrificial spacer segment 132 and channel segments 142 exposed between the partition templates 190 can be removed to form a trench between a pair of free-standing partial stacks 107. The exposed portions of the sacrificial spacer segment 132 and channel segments 142 can be removed using a sequence of selective directional etches (e.g., RIE) to divide the sacrificial spacer segment 132 and channel segments 142 into alternating sacrificial spacer slabs 134 and channel slabs 144 of two adjacent free-standing partial stacks 107.

Figure 8:
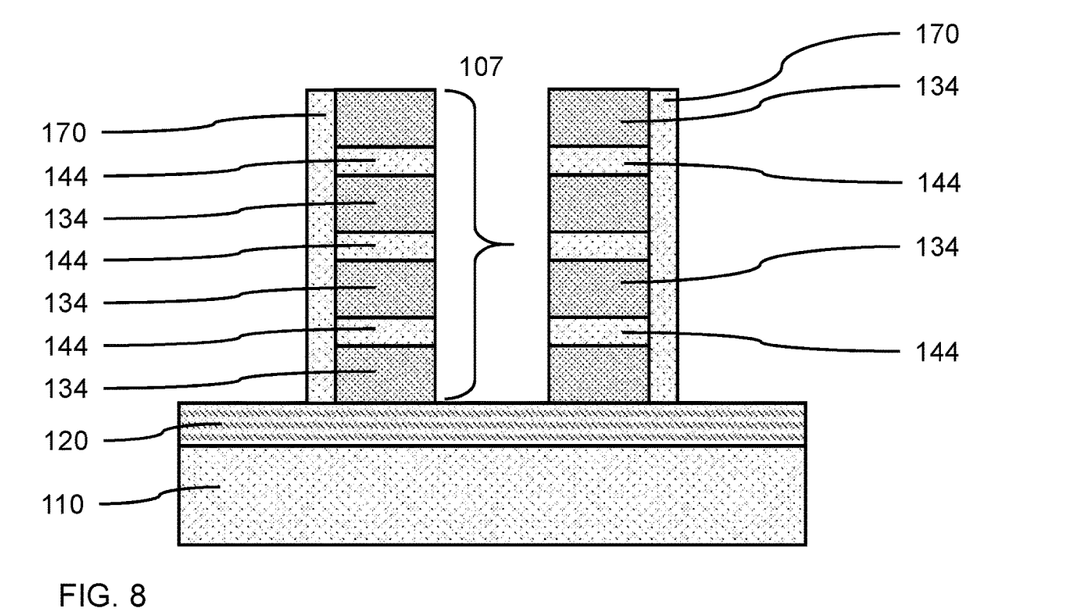
FIG. 8 is a cross-sectional side view showing the partition templates removed and sacrificial fill layer removed from the channel sidewalls, in accordance with an embodiment of the present invention.

FIG. 8 is a cross-sectional side view showing the partition templates removed and sacrificial fill layer removed from the channel sidewalls, in accordance with an embodiment of the present invention.

In one or more embodiments, the partition templates 190 can be removed from the free-standing partial stacks 107, where the partition templates 190 can be removed using a selective isotropic etch (e.g., wet chemical etch) or a selective directional etch (e.g., RIE). The partition templates 190 can be selectively removed relative to the insulating layer 120, which can be exposed between the pair of free-standing partial stacks 107, where the insulating layer 120 is a different dielectric material from the partition templates 190.

In one or more embodiments, the sacrificial fill layer 180 can be removed using a selective isotropic etch to expose the insulating layer 120 and channel sidewalls 170. The two adjacent free-standing partial stacks 107 can remain on the insulating layer 120 separated by the a distance equal to the gap between the partition templates 190. The channel sidewalls 170 can be on opposite facing sides of the sacrificial spacer slabs 134 and channel slabs 144 forming an adjacent pair of comb-like structures.

Figure 9:
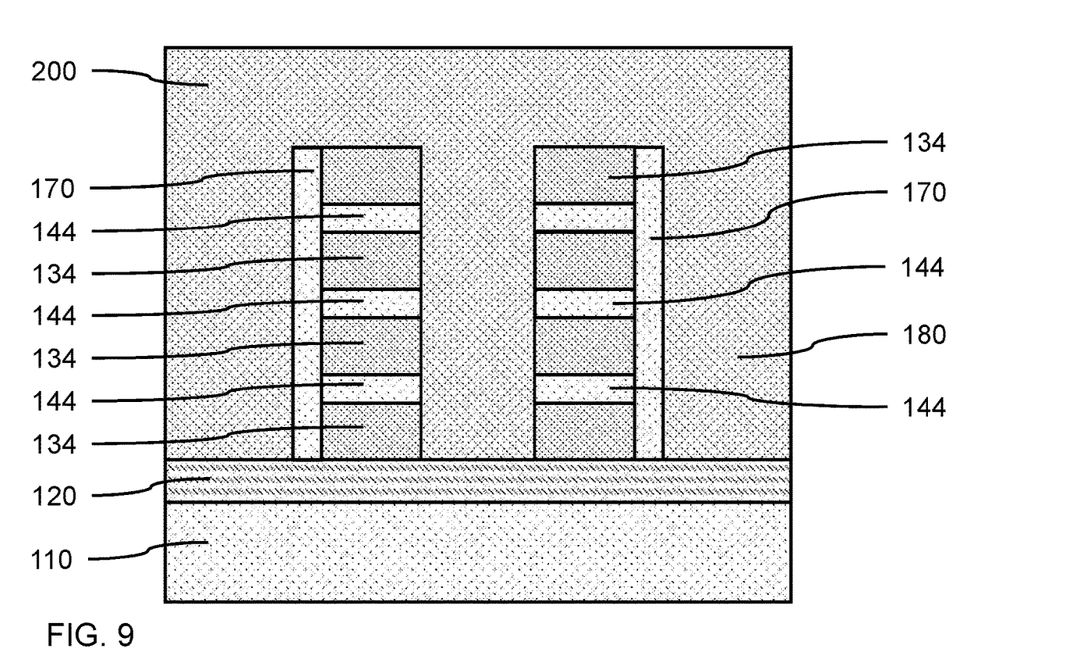
FIG. 9 is a cross-sectional side view showing a dummy gate structure formed across the pair of free-standing partial stacks, in accordance with an embodiment of the present invention.

FIG. 9 is a cross-sectional side view showing a dummy gate structure formed across the pair of free-standing partial stacks, in accordance with an embodiment of the present invention.

In one or more embodiments, a dummy gate structure can be formed across the pair of free-standing partial stacks 107, where the dummy gate structure can be formed by blanket depositing a dummy gate layer on the partial stacks 107, and patterning the dummy gate layer to form the dummy gate 200. Gate spacers 210 can be formed on the sidewalls of the dummy gate 200 by a conformal deposition, for example, atomic layer deposition (ALD) or plasma enhanced ALD (PEALD), and removing the portion of the gate spacer material from the top surface of the dummy gate 200.

In various embodiments, the dummy gate 200 can be amorphous silicon (a-Si), amorphous carbon (a-C), germanium (Ge), silicon-germanium (SiGe), or other easily etchable materials that can be selectively removed from the sacrificial spacer segments 132 and channel segments 142 on the insulating layer 120. Although shown as one piece, the dummy gate may include a dummy gate dielectric (e.g., silicon oxide) and a dummy gate fill (e.g., a-Si).

Figure 10:
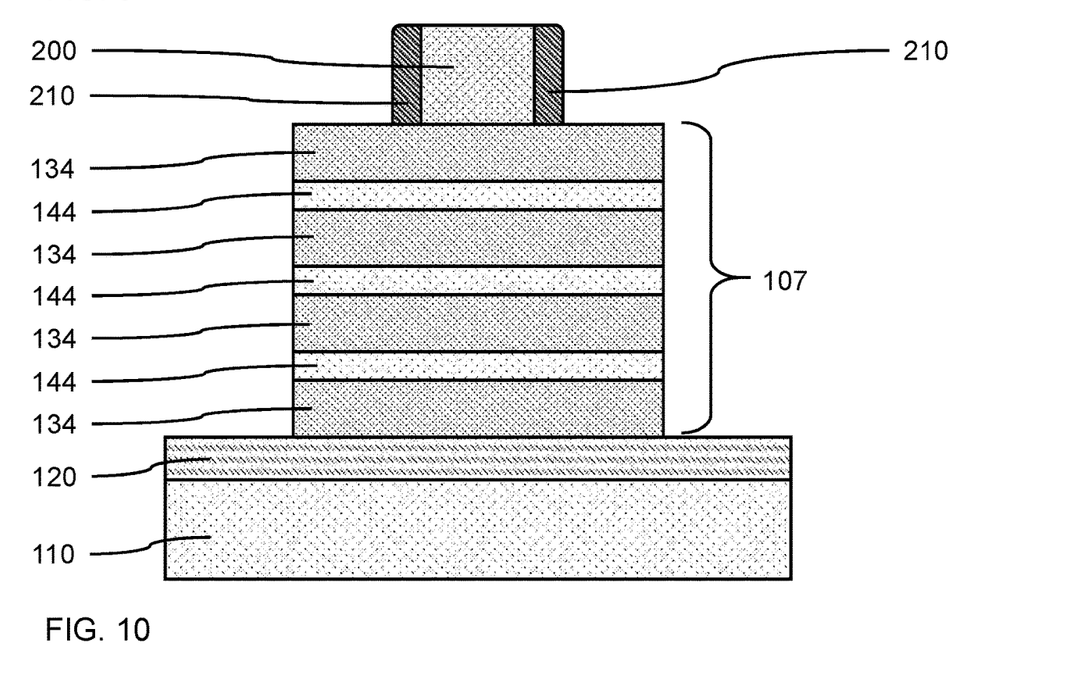
FIG. 10 is a cross-sectional side view perpendicular to FIG. 9 showing a portion of the dummy gate structure on the topmost sacrificial spacer segment, in accordance with an embodiment of the present invention.

FIG. 10 is a cross-sectional side view perpendicular to FIG. 9 showing a portion of the dummy gate structure on the topmost sacrificial spacer segment, in accordance with an embodiment of the present invention.

In one or more embodiments, the dummy gate 200 and gate spacers 210 can cover a center portion of each of the free-standing partial stacks 107, including the alternating sacrificial spacer slabs 134 and channel slabs 144. In various embodiments, the dummy gate 200 can be a different material from the sacrificial spacer slabs 134 and channel slabs 144, so exposed portions of the sacrificial spacer slabs 134 and channel slabs 144 can be selectively removed using the dummy gate 200 and gate spacers 210 as a mask.

Figure 11:
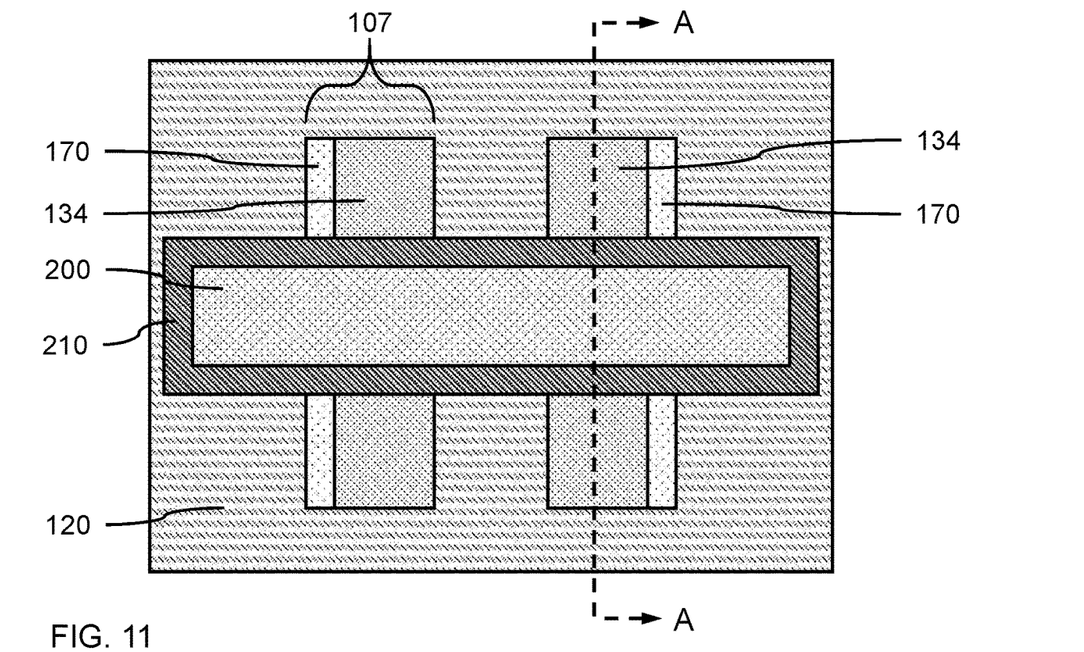
FIG. 11 is a top view showing a dummy gate structure formed across the pair of free-standing partial stacks, in accordance with an embodiment of the present invention.

FIG. 11 is a top view showing a dummy gate structure formed across the pair of free-standing partial stacks, in accordance with an embodiment of the present invention.

In one or more embodiments, the dummy gate structure can be across a center portion of the pair of free-standing partial stacks 107, such that a portion of the channel sidewalls 170, sacrificial spacer slabs 134, and channel slabs 144 extend beyond the gate spacers 210 on opposite sides. The gate spacer 210 can surround the dummy gate 200 on four sides.

Figure 12:
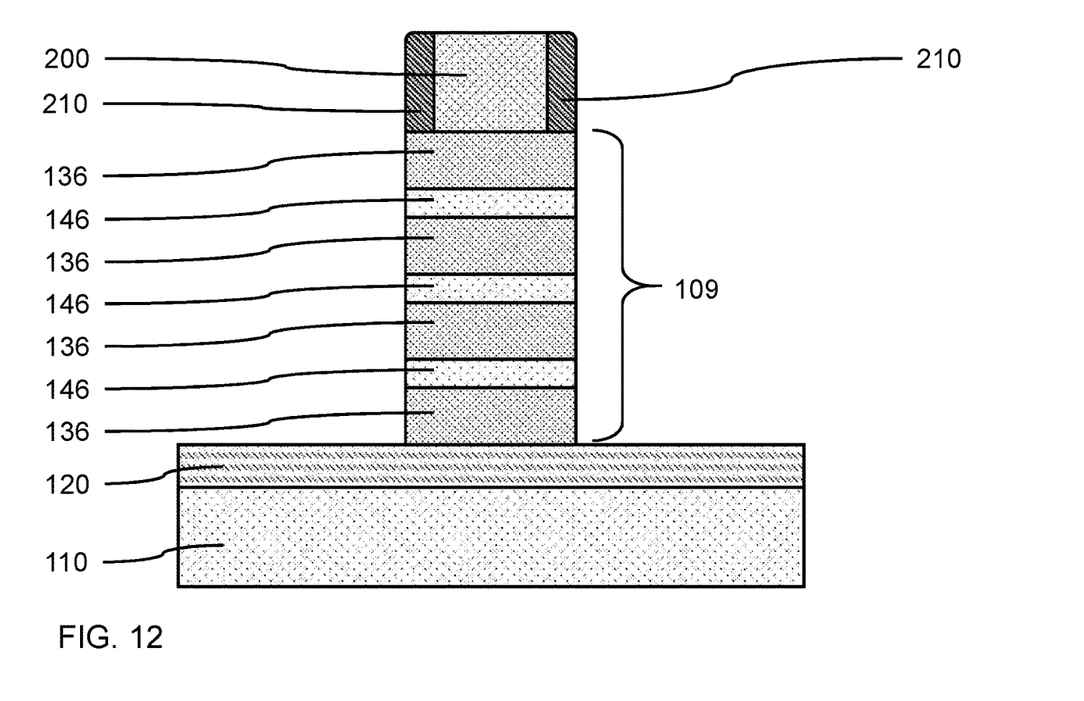
FIG. 12 is a cross-sectional side view showing the partial stacks of sacrificial spacer slabs and channel slabs trimmed back to form a nanosheet column of sacrificial plates and channel plates below the dummy gate structure, in accordance with an embodiment of the present invention.

FIG. 12 is a cross-sectional side view along the A-A cross-section of FIG. 11 showing the partial stacks of sacrificial spacer slabs and channel slabs trimmed back to form a nanosheet column of sacrificial plates and channel plates below the dummy gate structure, in accordance with an embodiment of the present invention.

In one or more embodiments, the partial stacks 107 of sacrificial spacer slabs 134, and channel slabs 144 can be trimmed back to form a nanosheet column 109 of sacrificial plates 136 and channel plates 146 below the gate spacers 210 and dummy gate 200 of the dummy gate structure. The channel plates 146 can be in physical and electrical contact with the channel sidewall 170 to form a comb-like structure having both horizontal and vertical components, where the channel plates 146 extend outward from a side face of the channel sidewall 170. The width of the channel plates 146 can determine the gate length of a resulting comb-shaped nanosheet device, and the channel sidewall 170 can increase the effective width of the gate by adding to the charge carrying capacity and effective drive current of the channel, while maintaining the size and chip area of the transistor device.

Figure 13:
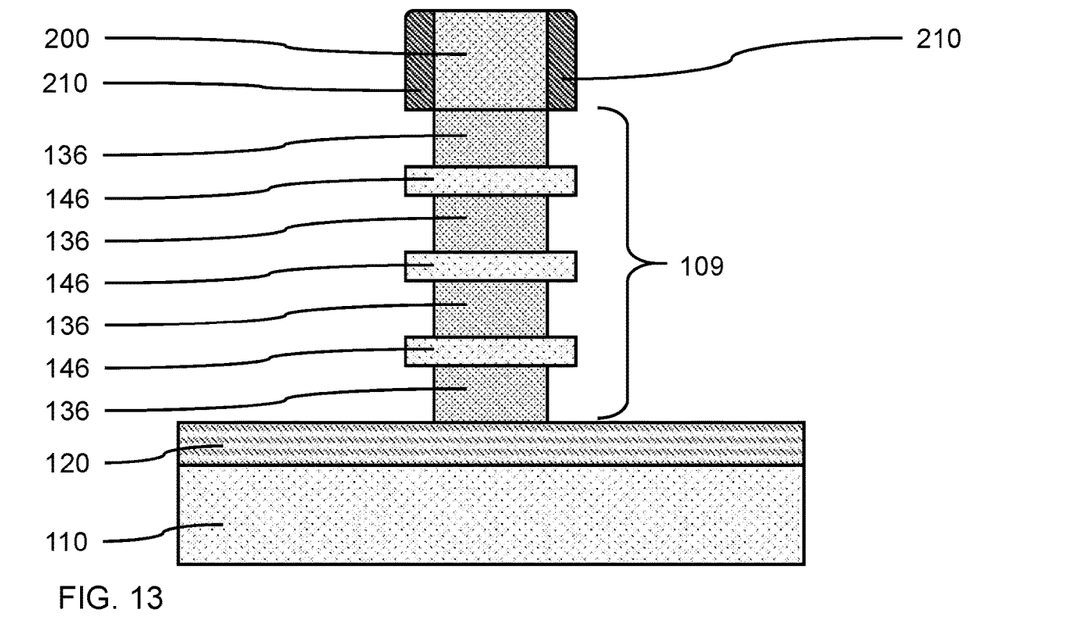
FIG. 13 is a cross-sectional side view showing opposite sides of the sacrificial plates of the nanosheet column recessed, in accordance with an embodiment of the present invention.

FIG. 13 is a cross-sectional side view showing opposite sides of the sacrificial plates of the nanosheet column recessed, in accordance with an embodiment of the present invention.

In one or more embodiments, opposite sides of the sacrificial plates 136 of the nanosheet column 109 can be recessed using an isotropic etch. The recesses formed in the sacrificial plates 136 can be sufficiently deep to allow an insulating dielectric material to cover the entire sidewall of the sacrificial plate 136. In various embodiments, the recesses can be about as deep as the gate spacers 210 are thick.

Figure 14:
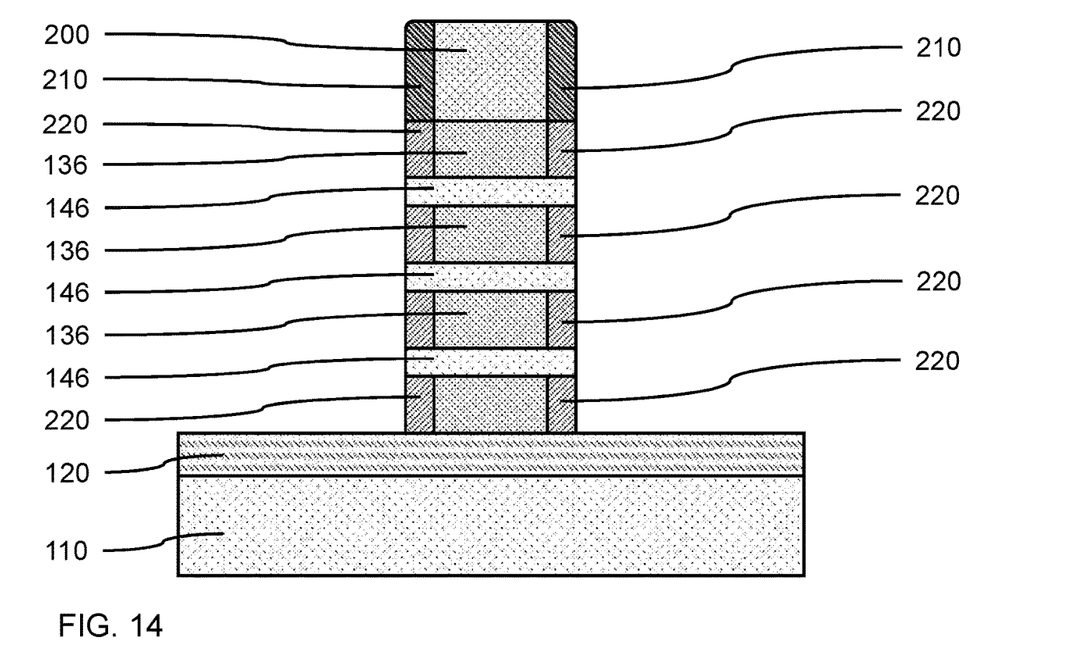
FIG. 14 is a cross-sectional side view showing inner spacers formed in the recesses on opposite sides of the sacrificial plates, in accordance with an embodiment of the present invention.

FIG. 14 is a cross-sectional side view showing inner spacers formed in the recesses on opposite sides of the sacrificial plates, in accordance with an embodiment of the present invention.

In one or more embodiments, inner spacers 220 can be formed in the recesses on opposite sides of the sacrificial plates 136, where the inner spacers 220 can be formed by a conformal deposition (e.g., ALD, PEALD) and etched back using an isotropic etch or a directional etch (e.g., RIE). In various embodiments, the inner spacers 220 can be an insulating dielectric material.

Figure 15:
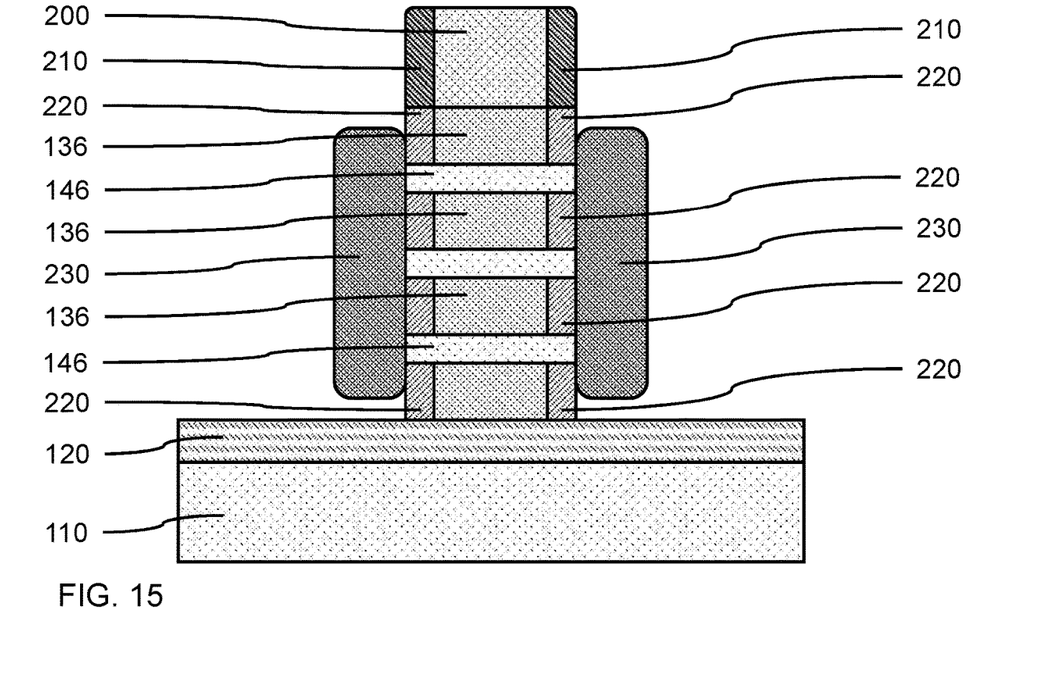
FIG. 15 is a cross-sectional side view showing source/drains formed on the exposed surfaces of the channel plates of the nanosheet column, in accordance with an embodiment of the present invention.

FIG. 15 is a cross-sectional side view showing source/drains formed on the exposed surfaces of the channel plates of the nanosheet column, in accordance with an embodiment of the present invention.

In one or more embodiments, source/drains 230 can be formed on the exposed surfaces of the channel plates 146, where the source/drains 230 can be formed by a lateral epitaxial growth. The source/drains 230 can be doped to form n-type transistor devices or p-type transistor devices.

Figure 16:
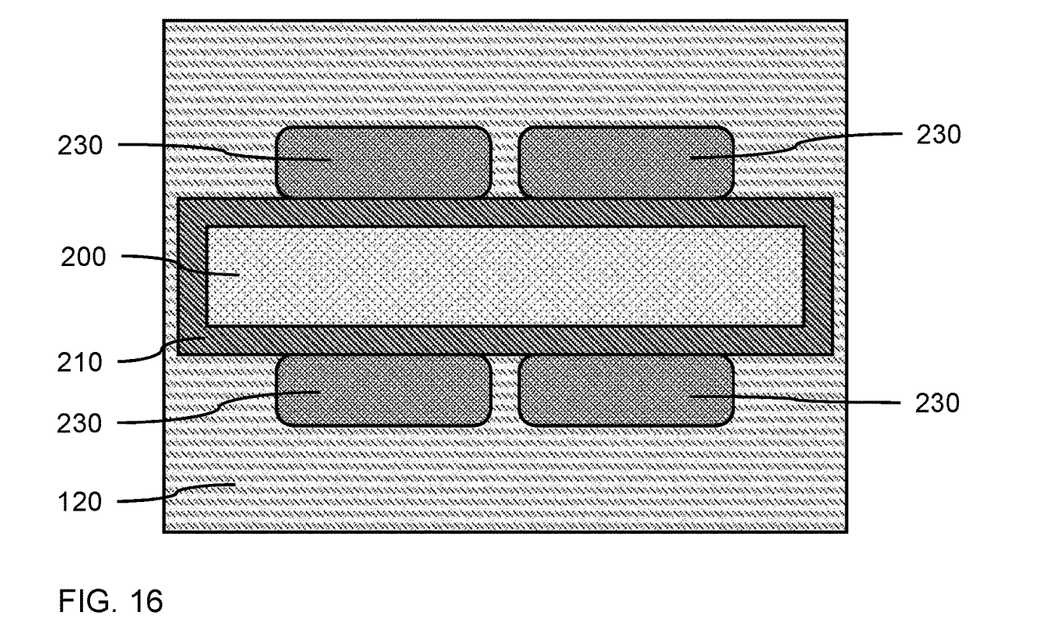
FIG. 16 is a top view showing the source/drains exposes on opposite sides of each of the nanosheet columns below the dummy gate structure, in accordance with an embodiment of the present invention.

FIG. 16 is a top view showing the source/drains exposes on opposite sides of each of the nanosheet columns below the dummy gate structure, in accordance with an embodiment of the present invention.

In one or more embodiments, source/drains 230 can be formed on adjacent nanosheet column 109, where the source/drains 230 can be separate or merged.

Figure 17:
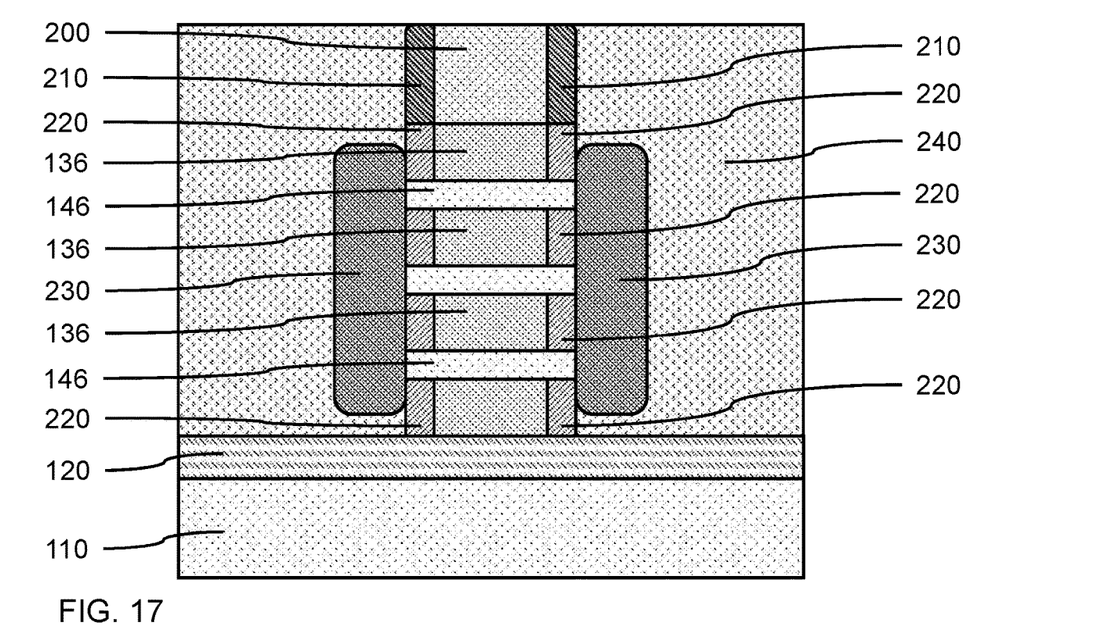
FIG. 17 is a cross-sectional side view showing a dielectric fill layer formed on the source/drains and dummy gate structure, in accordance with an embodiment of the present invention.

FIG. 17 is a cross-sectional side view showing a dielectric fill layer formed on the source/drains and dummy gate structure, in accordance with an embodiment of the present invention.

In one or more embodiments, a dielectric fill layer 240 can be formed on the source/drains 230 and dummy gate structure, where the dielectric fill layer 240 can be formed by a blanket deposition. The dielectric fill layer 240 can be an insulating dielectric material, including, but not limited to, silicon oxide (SiO), silicon nitride (SiON), silicon oxynitride (SiON), a low-k dielectric material, or a combination thereof.

Figure 18:
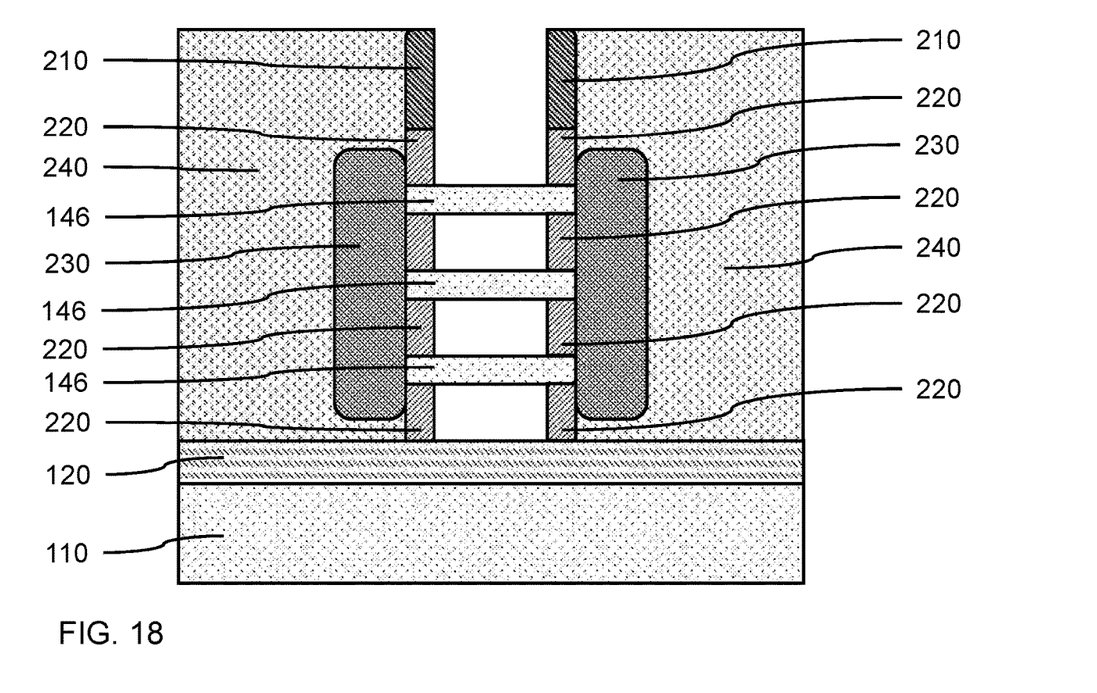
FIG. 18 is a cross-sectional side view showing the dummy gate removed from within the gate spacer, and the sacrificial plates removed from between the inner spacers and channel plates, in accordance with an embodiment of the present invention.

FIG. 18 is a cross-sectional side view showing the dummy gate removed from within the gate spacer, and the sacrificial plates removed from between the inner spacers and channel plates, in accordance with an embodiment of the present invention.

In one or more embodiments, the dummy gate 200 can be removed from within the gate spacer 210, where the dummy gate 200 can be removed using a selective, isotropic etch. Removal of the dummy gate 200 can expose the sacrificial plates 136 and channel plates 146, where the sidewalls of the sacrificial plates 136 and channel plates 146 can be exposed.

In one or more embodiments, the sacrificial plates 136 can be removed from between the inner spacers 220 and channel plates 146, where the sacrificial plates 136 can be removed using a selective, isotropic etch. Removal of the sacrificial plates 136 can form spaces between the channel plates 146.

Figure 19:
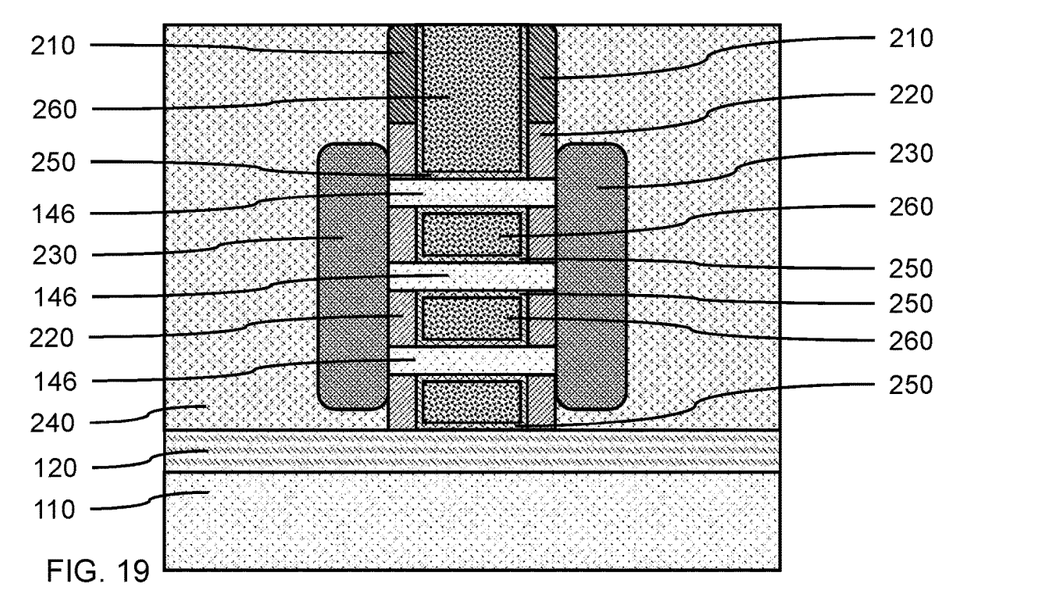
FIG. 19 is a cross-sectional side view showing a gate dielectric layer and a conductive gate electrode formed on the channel plates, inner spacers, and gate spacers, in accordance with an embodiment of the present invention.

FIG. 19 is a cross-sectional side view showing a gate dielectric layer and a conductive gate electrode formed on the channel plates, inner spacers, and gate spacers, in accordance with an embodiment of the present invention.

In one or more embodiments, a gate dielectric layer 250 can be formed on the channel plates 146, inner spacers 220, and gate spacers, where the gate dielectric layer 250 can be formed by a conformal deposition (e.g., ALD, PEALD).

In various embodiments, the gate dielectric layer 250 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 250 can have a thickness in a range of about 1 nm to about 3 nm, or about 2 nm, although other thicknesses are also contemplated.

In one or more embodiments, a work function layer can be formed on the gate dielectric layer 190, where the work function layer can be formed by a conformal deposition.

In various embodiments, the work function layer can be a conducting transition metallic nitride or carbide compound material, for example, tantalum nitride (TaN), titanium nitride (TiN), tantalum carbide (TaC), titanium carbide (TiC), titanium aluminum carbide (TiAlC), and combinations thereof.

In one or more embodiments, a conductive gate electrode 260 can be formed in the open spaces on the gate dielectric layer 250, where the conductive gate electrode 260 can be formed by a conformal deposition (e.g., ALD, PEALD).

In various embodiments, the conductive gate electrode 260 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials.

Figure 20:
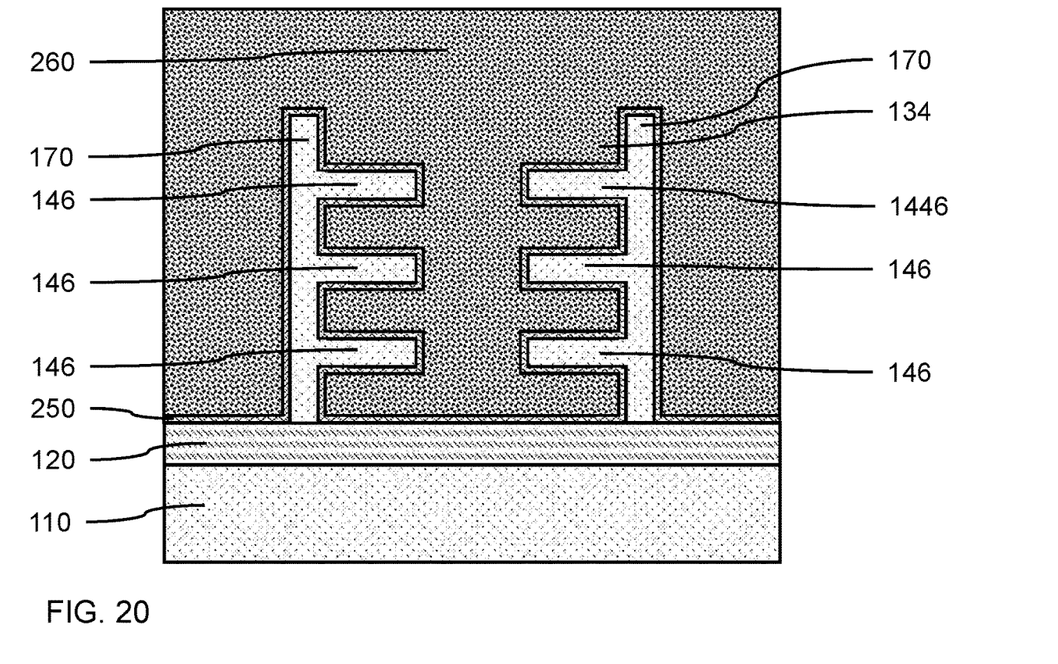
FIG. 20 is a cross-sectional side view perpendicular to FIG. 19 showing the gate dielectric layer and the conductive gate electrode of the gate structure on the channel plates, in accordance with an embodiment of the present invention.

FIG. 20 is a cross-sectional side view perpendicular to FIG. 19 showing the gate dielectric layer and the conductive gate electrode of the gate structure on the channel plates, in accordance with an embodiment of the present invention.

In various embodiments, the channel sidewalls 170 and channel plates 146 can form a comb-like channel structure for the field effect transistor device, where the channel sidewalls 170 and channel plates 146 combine the device width to increase the drive current capacity of the transistor device. The channel sidewall and the plurality of channel plates increase the channel width and increase the drive current capacity of the field effect transistor device relative to a fin field effect transistor or nanosheet field effect transistor alone having similar feature dimensions.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates other rise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms ended to encompass different orientations of the device in use or operation addition A the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a comb-shaped transistor device, comprising:
    forming a stack of alternating sacrificial spacer segments and channel segments on a substrate;
    forming channel sidewalls on opposite sides of the stack of alternating sacrificial spacer segments and channel segments;
    dividing the stack of alternating sacrificial spacer segments and channel segments into alternating sacrificial spacer slabs and channel slabs, wherein the channel slabs and channel sidewalls form a pair of comb-like structures;
    trimming the sacrificial spacer slabs and channel slabs to form a nanosheet column of sacrificial plates and channel plates; and
    forming source/drains on opposite sides of the sacrificial plates and channel plates.

2. The method of claim 1, further comprising forming a dummy gate structure across the pair of comb-like structures, and using the dummy gate structure as a mask for trimming the sacrificial spacer slabs and channel slabs.

3. The method of claim 2, further comprising removing a portion of the sacrificial plates from opposite sides to form recesses, and forming inner spacers in the recesses.

4. The method of claim 3, further comprising removing a portion of the dummy gate structure to expose the sacrificial plates, and removing the sacrificial plates to expose portions of the channel slabs.

5. The method of claim 4, further comprising forming a gate-all-around structure of the exposed portions of the channel slabs.

6. The method of claim 5, wherein the channel sidewall and channel plates form a comb-like channel structure for a field effect transistor device.

7. The method of claim 1, wherein the channel sidewalls are formed by lateral epitaxial growth.

8. The method of claim 7, wherein the sacrificial spacer segments are silicon-germanium (SiGe) and the channel segments are silicon (Si).

9. The method of claim 8, wherein the sacrificial spacer segments have a thickness in a range of about 6 nanometers (nm) to about 30 nm, and the channel segments have a thickness in a range of about 4 nanometers (nm) to about 12 nm.

10. A method of forming a comb-shaped transistor device, comprising:

forming a stack of alternating sacrificial spacer segments and channel segments on a substrate;

forming channel sidewalls on opposite sides of the stack of alternating sacrificial spacer segments and channel segments;

forming a pair of partition templates on the exposed surface of a topmost sacrificial spacer segment, wherein a center portion of the topmost sacrificial spacer segment is exposed between the pair of partition templates;

dividing the stack of alternating sacrificial spacer segments and channel segments into alternating sacrificial spacer slabs and channel slabs, wherein the channel slabs and channel sidewalls form an adjacent pair of comb-like structures;

forming a dummy gate structure across the pair of comb-like structures;

trimming the sacrificial spacer slabs and channel slabs using the dummy gate structure as a mask to form a nanosheet column of sacrificial plates and channel plates; and forming source/drains on opposite sides of the sacrificial plates and channel plates.

11. The method of claim 10, wherein the sacrificial spacer segments are silicon-germanium (SiGe) and the channel segments are silicon (Si).

12. The method of claim 11, further comprising removing a portion of the sacrificial plates from opposite sides to form recesses, and forming inner spacers in the recesses.

13. The method of claim 10, wherein the channel sidewalls have a thickness about equal to the thickness of the channel segments.

14. The method of claim 13, wherein the channel segments have a thickness in a range of about 4 nanometers (nm) to about 12 nm.

15. The method of claim 14, wherein the source/drains on the adjacent pair of comb-like structures form merged source/drains.

* * * * *